US010292298B2

(12) United States Patent
Yen et al.

(10) Patent No.: US 10,292,298 B2
(45) Date of Patent: May 14, 2019

(54) CABLE BRIDLE, CABLE BRIDLE MECHANISM AND SWAPPING SYSTEM USING THE SAME

(71) Applicant: Wistron Corporation, New Taipei (TW)

(72) Inventors: Wen-Tsan Yen, New Taipei (TW); Hung-Ming Chang, New Taipei (TW); Cheng-Te Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 334 days.

(21) Appl. No.: 14/954,970

(22) Filed: Nov. 30, 2015

(65) Prior Publication Data

US 2017/0079158 A1 Mar. 16, 2017

(30) Foreign Application Priority Data

Sep. 11, 2015 (TW) .............................. 104130041 A

(51) Int. Cl.
*H05K 7/14* (2006.01)
(52) U.S. Cl.
CPC ......... *H05K 7/1491* (2013.01); *H05K 7/1485* (2013.01); *H05K 7/1489* (2013.01)
(58) Field of Classification Search
CPC ...... H05K 7/14; H05K 7/1485; H05K 7/1489; H05K 7/1491; F16L 3/015; F16L 3/02; F16L 3/06; F16L 3/08; F16L 3/12; H02G 11/006; F16C 29/045
See application file for complete search history.

(56) References Cited

U.S. PATENT DOCUMENTS 6,305,556 B1 * 10/2001 Mayer ....................... G06F 1/18
211/175
6,327,139 B1 * 12/2001 Champion ............. H02B 1/202
174/69
8,780,538 B2 * 7/2014 Fu ........................ H02G 11/006
361/679.02

(Continued)

FOREIGN PATENT DOCUMENTS

CN 201438567 4/2010

OTHER PUBLICATIONS

The Picture of V shaped spring, downloaded on Nov. 26, 2015, at http://tw.ttnet.net/ttnet/gotoprd/HD135/000/0/754303030393635303.htm.

(Continued)

*Primary Examiner* — Steven T Sawyer
*Assistant Examiner* — Sagar Shrestha
(74) *Attorney, Agent, or Firm* — JCIPRNET

(57) ABSTRACT

A swapping system including a first device, a second device, a cable, and at least one cable bridle is provided. The first device has a receiving space. The second device is movably disposed in the receiving space for moving into or moving out of the first device. The cable located in the receiving space is electrically connected between the first and the second devices. The cable is received or released according to a relative motion of the first and the second devices. The cable bridle is disposed on the cable, the second device is moved into the first device so that the cable is received, and the cable is constrained by the cable bridle to form at least one bending when the cable is received. A cable bridle mechanism and a cable bridle are also provided.

23 Claims, 8 Drawing Sheets

(56) References Cited

U.S. PATENT DOCUMENTS

| | | | | |
|---|---|---|---|---|
| 8,882,055 B2* | 11/2014 | Yang | .................... | H05K 7/1491 |
| | | | | 174/69 |
| 9,867,311 B2* | 1/2018 | Chen | ........................ | F16L 3/015 |
| 2004/0090159 A1* | 5/2004 | Tsutsumi | ............... | H02G 11/00 |
| | | | | 312/330.1 |
| 2004/0120133 A1* | 6/2004 | Nguyen | ............... | H05K 7/1491 |
| | | | | 361/825 |
| 2005/0145582 A1* | 7/2005 | Dubon | ................... | H02G 3/128 |
| | | | | 211/26 |
| 2006/0113433 A1* | 6/2006 | Chen | .................... | H05K 7/1491 |
| | | | | 248/70 |
| 2013/0050963 A1* | 2/2013 | Zhou | .................... | H02G 11/006 |
| | | | | 361/752 |
| 2013/0077219 A1* | 3/2013 | Fu | ........................ | H02G 11/006 |
| | | | | 361/679.02 |
| 2013/0341471 A1* | 12/2013 | Yang | .................... | H05K 7/1491 |
| | | | | 248/70 |
| 2014/0158834 A1* | 6/2014 | Chen | .................... | H05K 7/1491 |
| | | | | 248/68.1 |
| 2015/0282295 A1* | 10/2015 | Matsumoto | .............. | H05K 3/14 |
| | | | | 361/749 |
| 2016/0161026 A1* | 6/2016 | Chen | ........................ | F16L 3/015 |
| | | | | 248/70 |
| 2016/0215901 A1* | 7/2016 | Takeuchi | ............. | G02B 6/4461 |

OTHER PUBLICATIONS

"Office Action of China Counterpart Application", dated Nov. 21, 2018, p. 1-p. 13.

* cited by examiner

CABLE BRIDLE, CABLE BRIDLE MECHANISM AND SWAPPING SYSTEM USING THE SAME

CROSS-REFERENCE TO RELATED APPLICATION

This application claims the priority benefit of Taiwan application serial no. 104130041, filed on Sep. 11, 2015. The entirety of the above-mentioned patent application is hereby incorporated by reference herein and made a part of this specification.

BACKGROUND OF THE INVENTION

Field of the Invention

The invention relates to a cable bridle, a cable bridle mechanism and a swapping system using the same.

Description of Related Art

With rapid development of information technology, computer hardware equipments have been constantly reformed in response to various changes. For example, in the early stage computers, the hard disk is installed inside a host housing of the computer. Yet, for the purpose of data storage or backup, or on basis of data portability and security measure, the so-called "mobilerack" (e.g., a hard disk tray) has been developed based on demands to provide users greater convenience. Furthermore, in the existing servers, a swapping system is also widely applied because of aforesaid advantages.

Hereinafter, the hard disk in the server is taken as an example. In general, to avoid entangled information cables in the space inside a computer system due to complex layout, the swapping hard disk module in conventional art adopts a back plate to organize data signals from multiple hard disks by simplified cables for transmission, so as to reduce loss of the cables. However, the back plate means higher cost and potential risk of damage. The reason is that, in addition to the circuitry layout, it also requires a considerable amount of connects. Specific connectors must be disposed at the inside the back plate for connecting to the corresponding data ports of the hard disks, and additional connects are also required at the outside of the back plate for outputting signals. Moreover, with increases in plugging times, it is inevitably that damage and deviation will occur on the ports and pins of the hard disk and the connectors to reduce the durability of the swapping hard disks, resulting in reduction of the overall durability of the system.

Based on the above, it has indeed become a problem to be considered and solved for person skilled in the art as how to use simple structure configuration to reduce the loss of the cables while satisfying the motion mechanism of the swapping structure as mentioned above.

SUMMARY OF THE INVENTION

The invention is directed to a cable bridle, a cable bridle mechanism and a swapping system using the same, which are capable of properly receiving and releasing the cable connected between different devices in the swapping system.

A swapping system of the invention includes a first device, a second device, a cable, and at least one cable bridle. The first device has a receiving space. The second device is movably disposed in the receiving space for moving into or moving out of the first device. The cable located in the receiving space is electrically connected between the first and the second devices. The cable is received or released according to a relative motion of the first and the second devices. The cable bridle is disposed on the cable. The second device is moved into the first device so that the cable is received, and the cable is constrained by the at least one cable bridle to form at least one bending when the cable is received.

A cable bridle mechanism of the invention is adapted to a cable. The cable bridle mechanism includes a track, a moving member and at least one cable bridle. The track has a path. The moving member is movably coupled to the track to move along the path, and the moving member has a buckling slot. The cable bridle has a body and at least one first buckling portion. The first buckling portion extends from the body to be buckled to the cable. The body has a second buckling portion facing away from the first buckling portion. The second buckling portion is engaged with the buckling slot to secure the body on the moving member. When the cable is received or released, the cable drives the cable bridle and the moving member to move along the path of the track and form a bending on a place where the cable and the body are buckled.

A cable bridle of the invention is adapted to a cable. The cable is electrically connected between a first device and a second device. The first device and the second device are movably assembled together. The cable is received or released according to a relative motion of the first device and the second device. The cable bridle includes a body and at least one first buckling portion. The first buckling portion extends from the body. The first buckling portion is buckled to the cable so that the body is contacted against the cable. When the cable is received or released according to the relative motion of the first device and the second device, the cable is constrained by the body to form a bending.

Based on the above, in the swapping system according to the invention, the cable bridles are disposed on the cable between two different devices. Accordingly, when said two devices are moved close to or away from each other by the relative motion, the cable can be constrained by the cable bridles to form at least one bending so that the cable can form a structure with multiple stacked sections due to the bendings when said two devices are moved close to each other to thereby achieve the effect of receiving.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
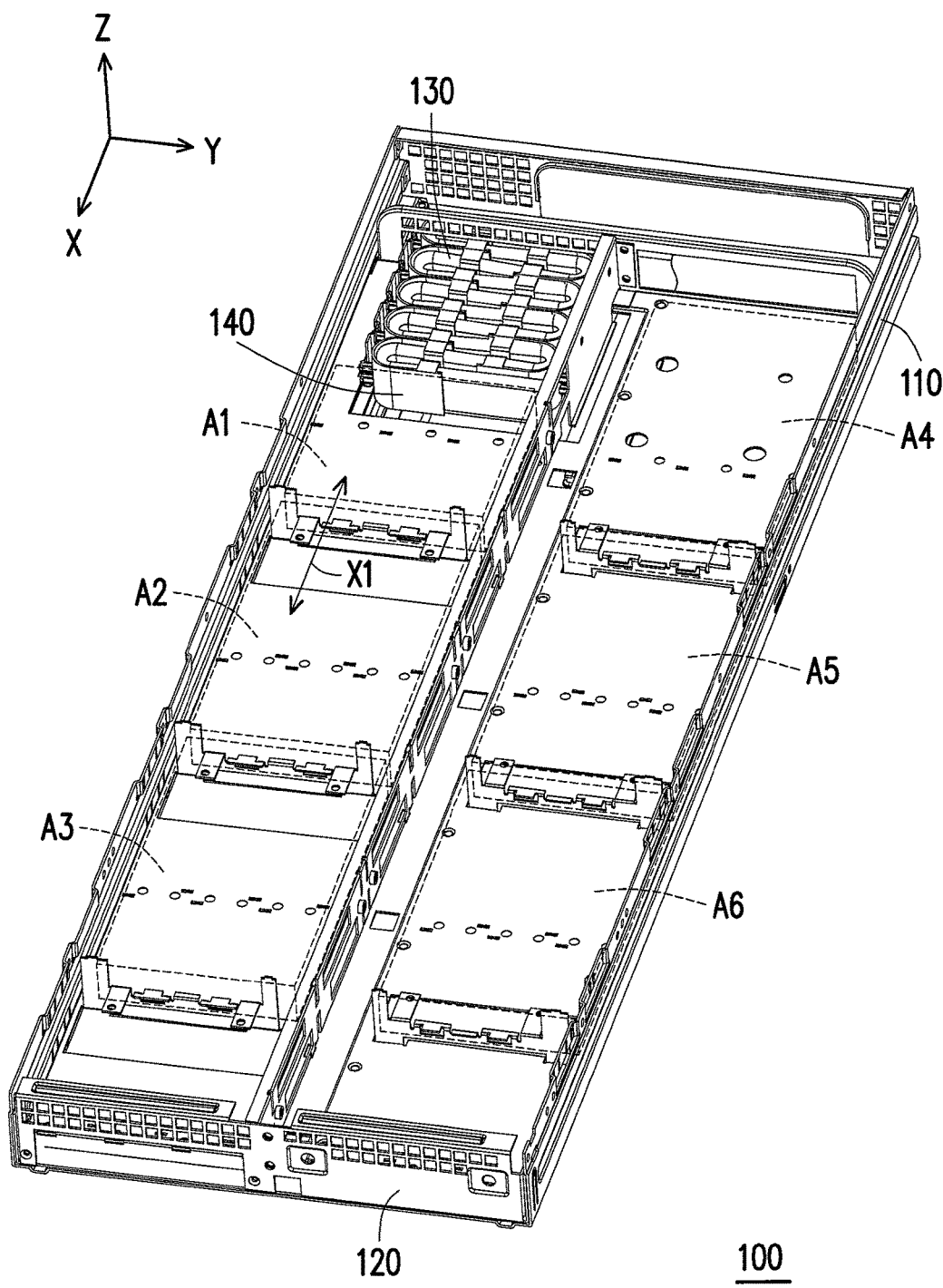
FIG. 1 is a schematic diagram illustrating a partial structure of a swapping system according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
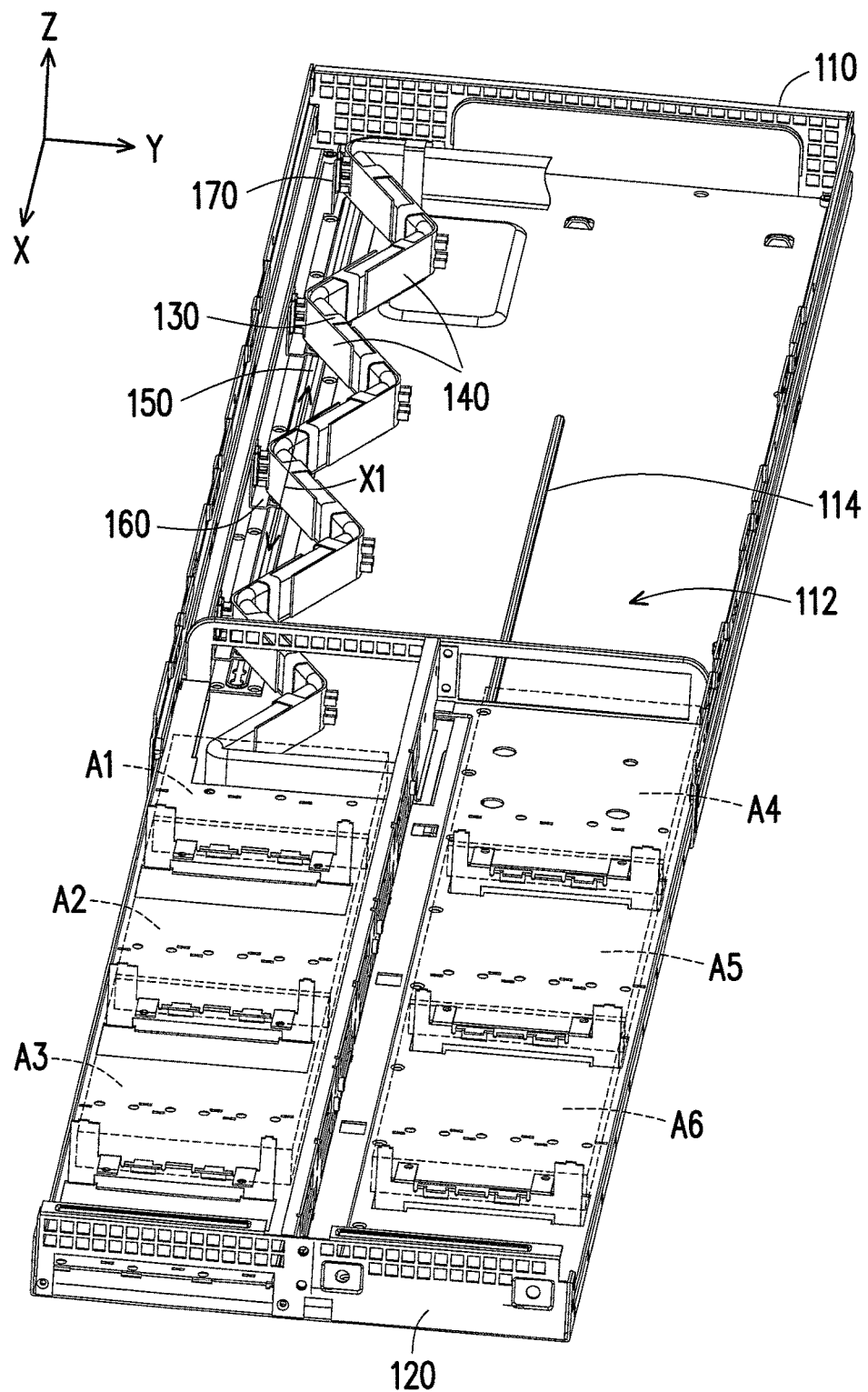
FIG. 2 is a schematic diagram illustrating another state of the swapping system depicted in FIG. 1.
Figure 3:
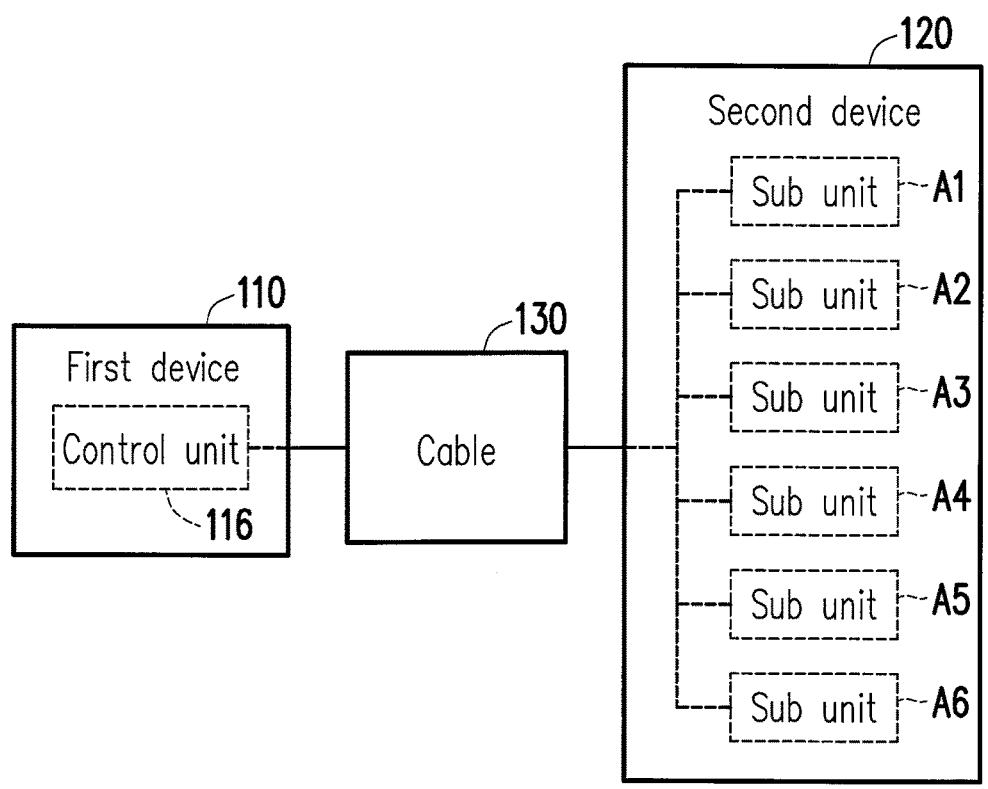
FIG. 3 is a block diagram of the swapping system depicted in FIG. 1.

FIG. 1 is a schematic diagram illustrating a partial structure of a swapping system according to an embodiment of the invention, in which a storage state of the swapping system is illustrated. FIG. 2 is a schematic diagram illustrating another state of the swapping system depicted in FIG. 1, in which an unfolding state of the swapping system is illustrated. FIG. 3 is a block diagram of the swapping system depicted in FIG. 1, in which an electrical connection relationship of related members of the swapping system is illustrated. Herein, a swapping case structure of the server is used as an example for the description, but the present embodiment is not limited thereto.

Referring to FIG. 1, FIG. 2 and FIG. 3 together, in the present embodiment, a swapping system 100 includes a first device 110, a second device 120, a cable 130 and a cable bridle 140. It should be noted that, the first device 110 is a host system of the server for example, which has a control unit 116, and the second device 120 is a swappable device (e.g., multiple electronic components such as disk drives, circuit boards or an array thereof) mounted on the host system for example. Herein, as shown in FIG. 1 and FIG. 2, the second device 120 has the characteristic of a drawer structure, on which a plurality of sub units A1 to A6 (i.e., those illustrated in dashed line contour) may be disposed and served as representative of a disk drive array. Further, the second device 120 can be movably disposed in a receiving space 112 of the first device 110 through a sliding track 114, so as to move into or move out of the receiving space 112 in X-axis. Accordingly, the user can pull the second device 120 out from the receiving space 112 through the drawer structure for replacing or maintaining the sub units A1 to A6, and push the second device 120 back to the receiving space 112 after said operations are completed.

The cable 130 is located in the receiving space 112 and electrically connected between the first device 110 and the second device 120 for supplying power to the sub units A1 to A6 from the host system (the control unit 116 of the first device 110) or signal transmission. Accordingly, the cable 130 will be received or released (i.e., a receiving state depicted in FIG. 1 and a releasing state depicted in FIG. 2) according to a motion status of the second device 120 relative to the first device 110. In order to successfully move the second device 120 out of the receiving space 112 and replace the sub units A1 to A6 under an uninterrupted power state, a length of the cable 130 must satisfy a length required for moving the second device 120 out of the receiving space 112. As such, it is required to provide sufficient space, structure and method for storing the cable 130 when moving the second device 120 into the receiving space 112.

Based on the above, the present embodiment adopts the cable bridle 140 disposed on the cable 130 so that the cable 130 is constrained by the cable bridle 140 to form at least one bending when the second device 120 is moved into the receiving space 112 of the first device 110. As such, the cable 130 may be received to accomplish the goal of storing the second device 120 inside the first device 110 without causing entanglement or interfering on the cable 130. Conversely, when the cable 130 is released or unfolded according to the relative motion of the first device 110 and the second device 120, the cable 130 may be unfolded based on the bending. Accordingly, as shown in FIG. 1, the present embodiment adopts the cable bridles 140 disposed on multiple positions on the cable 130, so as to form a plurality of bendings at the fixed positions and accordingly achieve the purpose of receiving and releasing.

More specifically, the cable bridles 140 of the present embodiment can also be movably disposed on the first device 110 along a path X1, so that the cable 130 may be successfully received. Accordingly, when the cable 130 is received or released according to the relative motion of the first device 110 and the second device 120, a plurality of portions on the cable 130 (i.e., portions on which the cable bridles 140 are respectively disposed) are constrained to move back and forth on the path X1. That is to say, with use of the cable bridles 140 on the cable 130, the portions of the cable 130 can move according to the fixed path X1, such that bendings formed on the fixed positions (the positions where the cable bridles 140 are respectively disposed) on the cable 130 can move along the path X1 towards the inside of the first device 110 when the second device 120 is moved into the receiving space 112. Therefore, the cable 130 is bent into multiple sections, and these sections may be stacked and received one by one, so that the cable 130 may be successfully stored between the first device 110 and the second device 120. On the other hand, when the second device 120 is moved out of the receiving space 112, the bendings formed on the fixed positions (the positions where the cable bridles 140 are respectively disposed) of the cable 130 also gradually move along an reversed direction of the path X1 (in a positive X-axis direction) towards the outside of the first device 110, so that the cable 130 may be successfully released or unfolded.

Figure 4:
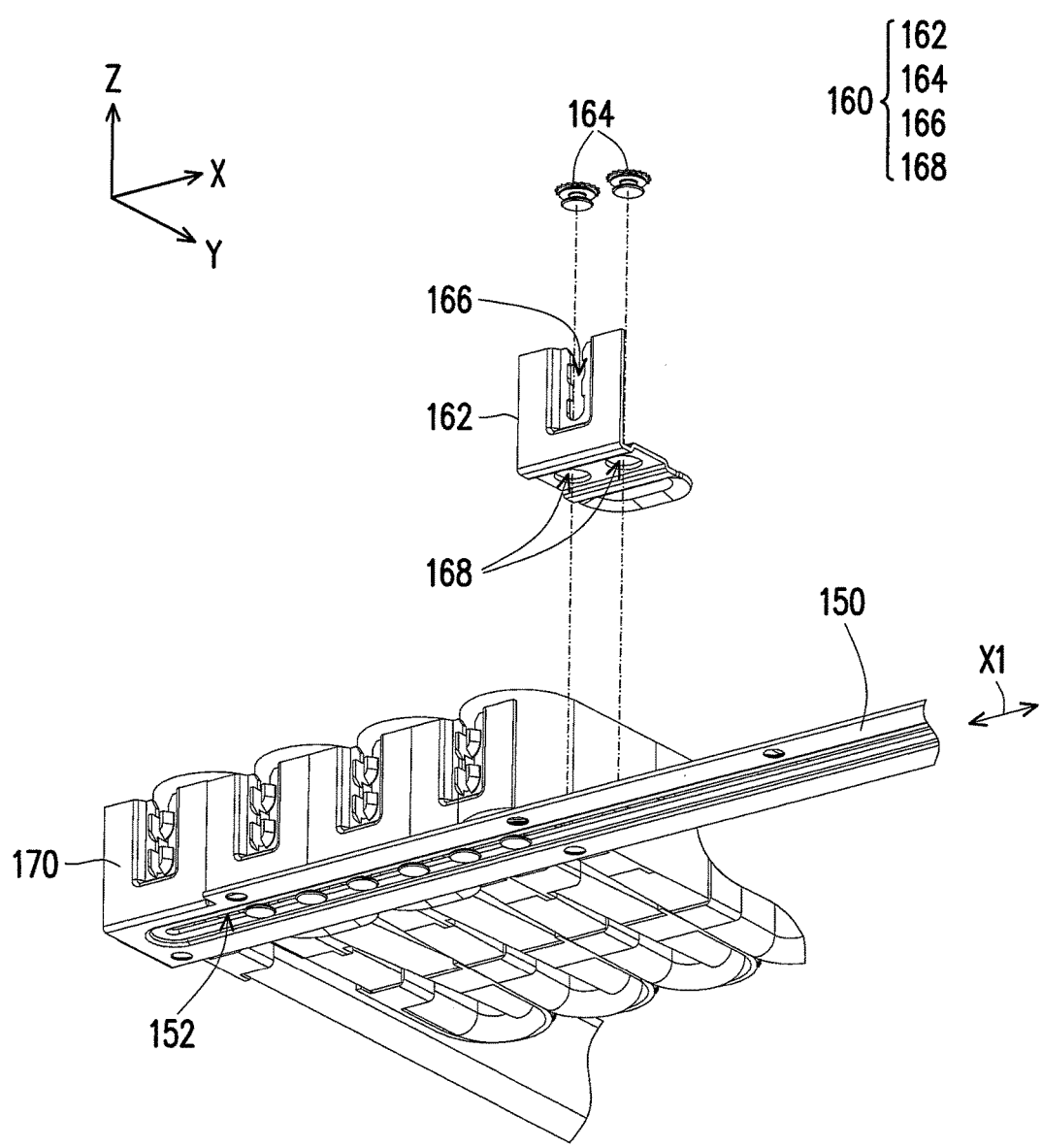
FIG. 4 and FIG. 5 are explosion diagrams illustrating part of the members in the swapping system depicted in FIG. 1 respectively from different perspectives.
Figure 5:
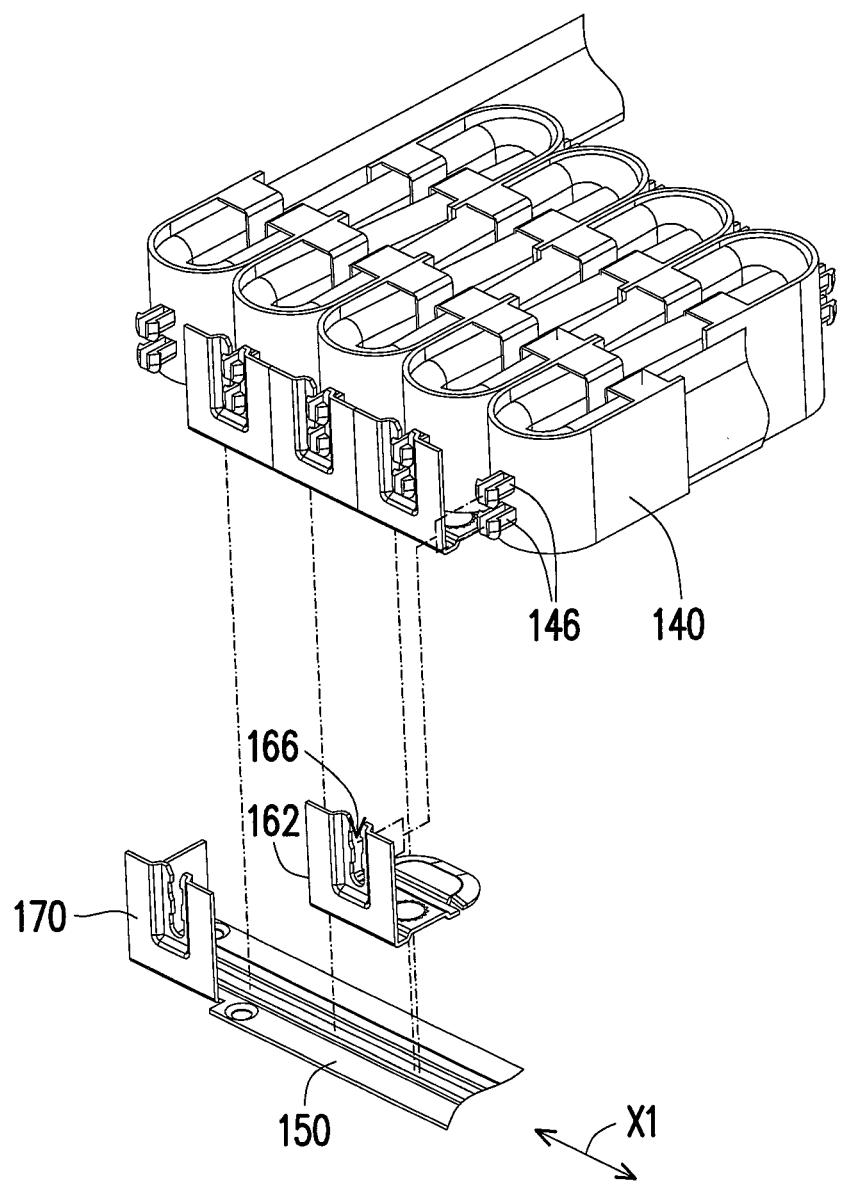

FIG. 4 and FIG. 5 are explosion diagrams illustrating part of the members in the swapping system depicted in FIG. 1 respectively from different perspectives. Referring to FIG. 1 and FIG. 2, and FIG. 4 and FIG. 5 together, in the present embodiment, the swapping system 100 further includes a track 150, a moving member 160 and a fixing member 170. The track 150 is disposed in the receiving space 112 of the first device 110, and an extending direction of the track 150 is identical to the path of the motion of the second device 120 relative to the first device 110 (i.e., the two are parallel), that is, the track 150 has aforesaid path X1. The fixing member 170 is disposed on one end of the track 150, such that a fixed position of the cable 130 is formed for bending and to serve as a fixed end when the cable 130 is received or released.

As shown in FIG. 4 and FIG. 5, the moving member 160 includes a carrier 162, a riveting member 164 and a riveting hole 168. The riveting member 164 passes through the riveting hole 168 on the carrier 162 to be engaged with a track trench 152 of the track 150 so that the carrier 162 is movably combined with the track 150. The moving member 160 further includes a buckling slot 166. The cable bridle 140 can be engaged with the moving member 160 through the buckling slot 160 so as to fix the cable bridle 140 on the moving member 160. More specifically, as shown in FIG. 5, the cable bridle 140 further includes a second buckling portion 146, which is configured to be engaged with the buckling slot 166 of the moving member 160 to fix a body 142 of the cable bridle 140 onto the moving member 160. Accordingly, the cable bridle 140 can move back and forth on the track 150 according to the moving member 160, so that the specific positions (i.e., where the cable bridles 140 are disposed) of the cable 130 can move back and forth along the path X1 depicted in FIG. 1 and FIG. 2 when the cable 130 is driven to be received or received according to the motion of the second device 120 relative to the first device 110. In other words, a cable bridle mechanism constituted by the track 150, the moving member 160 and the cable bridle 140 in the present embodiment is capable of providing effects of constraining and folding the cable 130 between the first device 110 and the second device 120 with relative motion in the swapping system 100.

Figure 6:
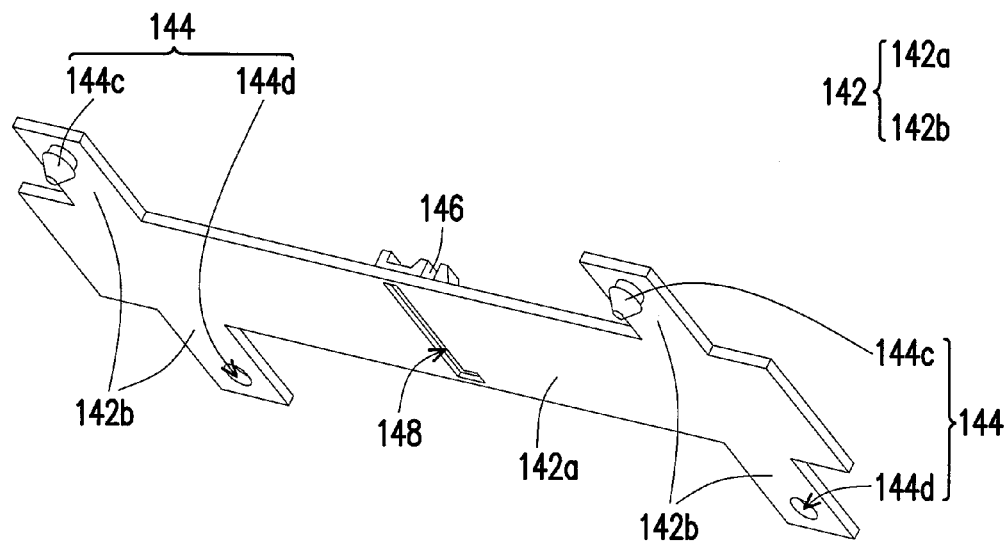
FIG. 6 and FIG. 7 are schematic diagrams respectively illustrating the cable bridle in different states.
Figure 7:
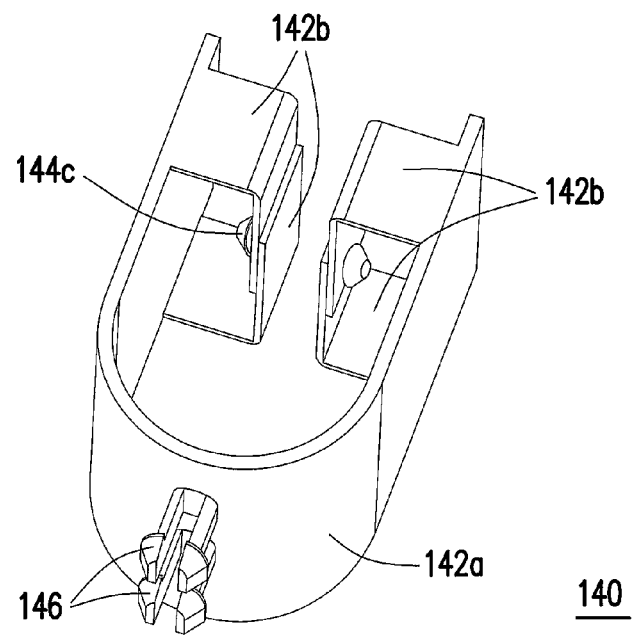

FIG. 6 and FIG. 7 are schematic diagrams respectively illustrating the cable bridle in different states. Referring to FIG. 6 and FIG. 7 together, specifically, the cable bridle 140 includes the body 142 and a first buckling portion 144. The first buckling portion 144 extends from the body 142 and is used to be buckled to the cable 130 so that the body 142 can be contacted against the cable 130, whereas the second buckling portion 146 extends from a main portion 142a and faces away from the first buckling portion 144. In the present embodiment, the body 142 is a flexible sheet (e.g., a plastic sheet) divided into the main portion 142a and a plurality of sub portions 142b extended from the main portion 142a. The first buckling portion 144 includes an engaging protrusion 144c and an opening 144d, which are respectively disposed at two of the sub portions 142b located on two opposite sides of the main portion 142a and corresponding to each other. Accordingly, the two of the sub portions 142b corresponding to each other are respectively bent relative to the main portion 142a to be partially overlapped, such that the two of the sub portions 142b are buckled together due to the engaging protrusion 144c being passed through and engaged with the opening 144d while the cable 130 is secured therein. As a result, the main portion 142a of the body 142 may be attached on the cable 130.

Furthermore, the cable bridle 140 of the present embodiment is in an unstressed state when being bent, and may generate an elastic deformation by force when the cable 130 is pulled straight. Therefore, when the second device 120 is moved into the receiving space 112 so that the cable 130 is received, an elastic restoring force of the cable bridle 140 can drive the cable 130 to bend at the positions where the cable 130 is attached by the main portion 142a. Accordingly, the cable 130 may be successfully bent and stacked at each of the positions where the cable bridles 140 are buckled in order to achieve the effect of receiving. Also, as shown in FIG. 1 and FIG. 2, in the cable 130 of the present embodiment, the cable bridles 140 are assembled on the moving members 160 and spaced apart from each other. That is to say, the cable 130 forms two types of bending because of the cable bridle 140, where one type of bending is formed due to the cable bridle 140 being assembled to the moving member 160, whereas another type of bending is in a free end state to maintain the freedom of the cable 130 when being received or released.

In addition, the body 142 further includes a trench 148, which is located on the main portion 142a and faces away from the second buckling portion 146. In terms of structure, the trench 148 can maintain elasticity and structural strength of the body 142 while allowing the body 142 to achieve a bending state as shown in FIG. 7.

However, it is not intended to limit related structure of the cable bridle 140 coupled to the first device 110 herein. That is, in another embodiment not illustrated, the cable bridle on the cable can be directly and slidably coupled to a bottom plate of the first device, so that the cable can be received or released according to a motion status of the cable bridle on the first device. Furthermore, the present embodiment is not intended to limit an amount of the cable bridles and the positions of the cable bridles disposed on the cable, which may be decided based on the environment and the requirements in use. That is, users may dispose the cable bridles on proper positions of the cable according to the length of the cable and a space between the first device and the second device. Moreover, the present embodiment is not intended to limit a form and an amount of the first buckling portions, any known buckling structure in the conventional technology capable of allowing the body of the cable bridle to tightly contact with the cable is suitable for the present embodiment.

Figure 8:
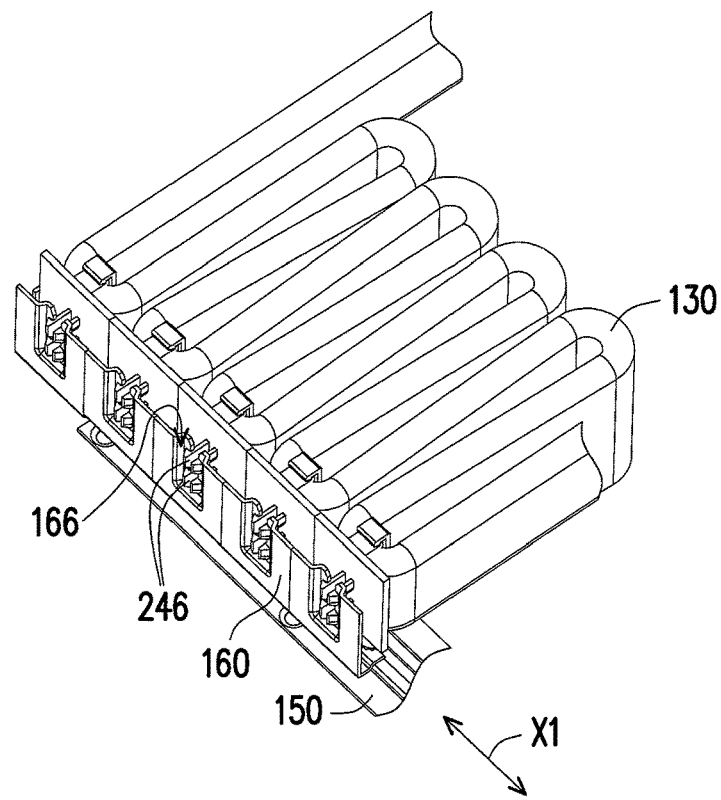
FIG. 8 is a schematic diagram illustrating a portion of a swapping system according to another embodiment of the invention.
Figure 9:
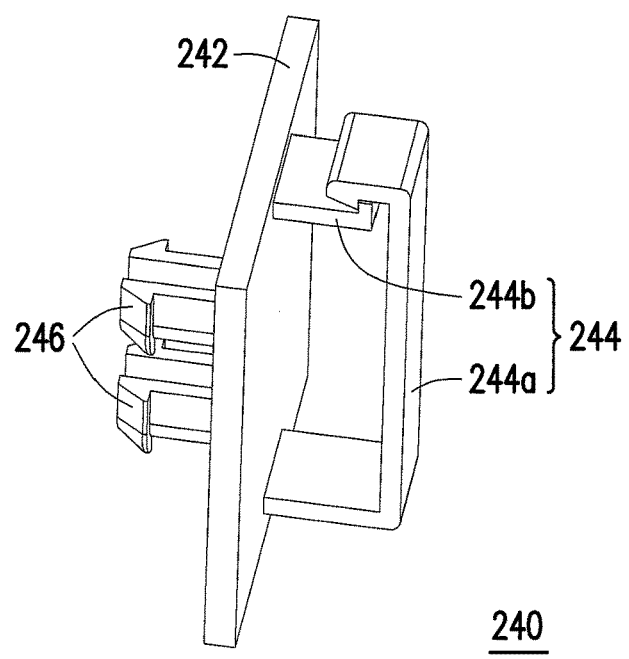
FIG. 9 is a schematic diagram illustrating the cable bridle in the swapping system depicted in FIG. 8.

FIG. 8 is a schematic diagram illustrating a portion of a swapping system according to another embodiment of the invention. FIG. 9 is a schematic diagram illustrating the cable bridle in the swapping system depicted in FIG. 8. The following description may refer to FIG. 8 and FIG. 9 together with reference to FIG. 1 and FIG. 2 of the foregoing embodiment. In the present embodiment, unlike the foregoing embodiment, a cable bridle 240 includes a body 242 and a first buckling portion 244, whereas a second buckling portion 246 extends and faces away from the first buckling portion 244. Furthermore, the first buckling portion 244 includes a contact protrusion 244b and an elastic locking hook 244a, which are respectively disposed on the body 242. The elastic locking hook 244a is engaged with the contact protrusion 244b so that the cable 130 passes through in between the body 242, the contact protrusion 244b and the elastic locking hook 244a. The elastic locking hook 244a is adapted to generate an elastic deformation by force to be released from the contact protrusion 244b. Accordingly, the cable 130 can also generate the bending through the cable bridle 240 and move along the track 150 according to the moving member 160 to be successfully received or released (unfolded), so as to accomplish the same effects of the foregoing embodiment.

Figure 10:
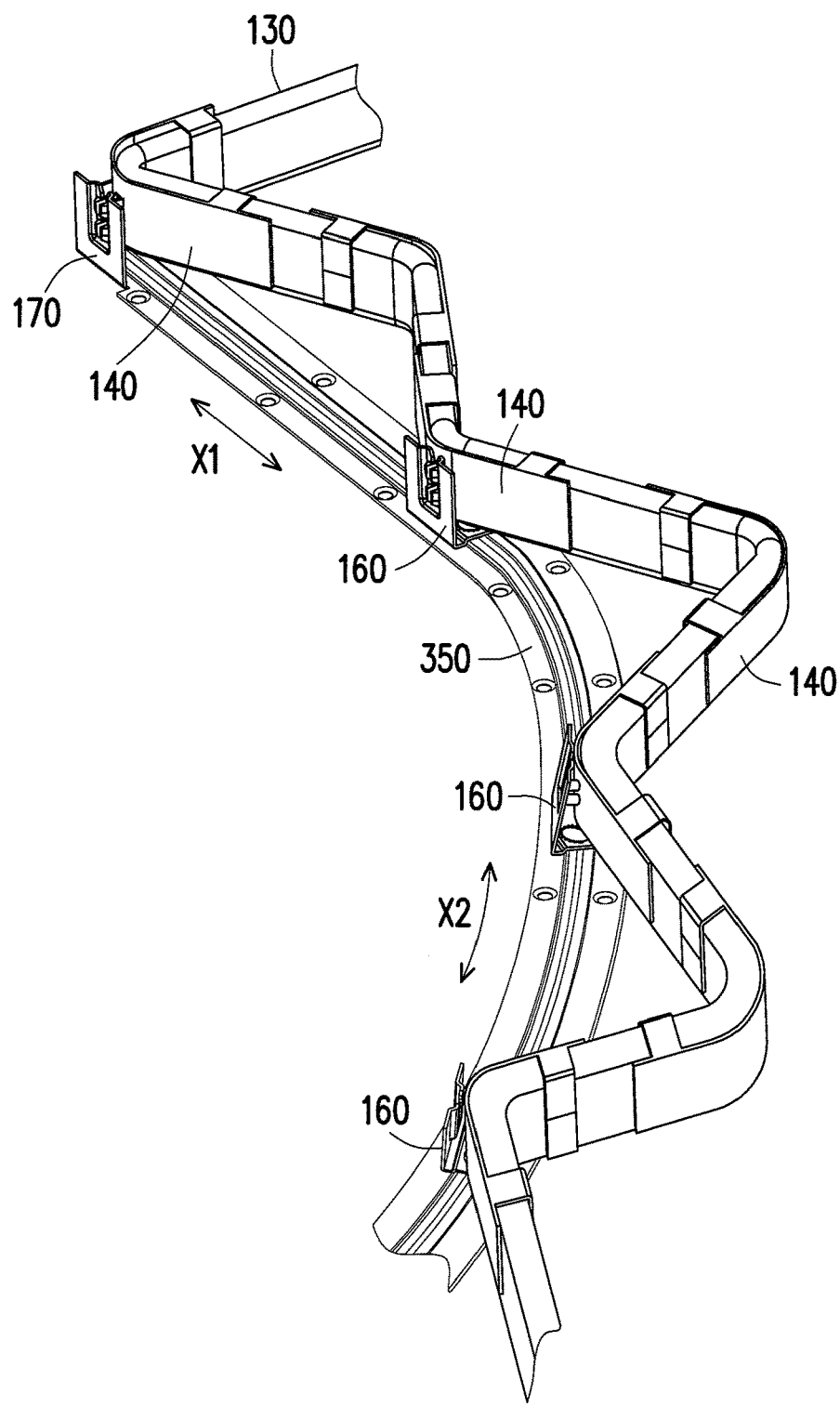
FIG. 10 is a schematic diagram illustrating a cable bridle mechanism according to yet another embodiment of the invention.

FIG. 10 is a schematic diagram illustrating a cable bridle mechanism according to yet another embodiment of the invention. Referring to FIG. 10, in the cable bridle mechanism of the present embodiment, unlike the foregoing embodiment, at least part of a track 350 is an arc line, and the moving members 160 and the cable bridle 140 (only part of them is shown herein) disposed on the track 350 are identical to those in the foregoing embodiment. Practically, except for the fixing member 170, the rest of the moving members 160 can all move along the different paths X1 and X2 of the track 350 during the process in which the cable 130 is received or released. By doing so, the cable bridle mechanism of the present embodiment is not limited to the swapping system only capable of performing straight line motion. That is, by changing the paths of the track 350, the cable bridle mechanism can be adapted to two devices with different motion paths to increase its applicability. In addition, a pivoting element (not illustrated) may also be disposed between the moving member 160 and the track 350, so that the moving member 160 can pivot in relative to the track 350 accordingly when the path is changed, so as to effectively avoid interferences from being generated with the track 350.

In summary, in the swapping system according to the foregoing embodiments of the invention, the cable bridles are disposed on the cable between two different devices. Accordingly, when said two devices are moved close to or away from each other by the relative motion, the cable can be constrained by the cable bridles to form at least one bending so that the cable can form a structure with multiple stacked sections due to the bendings when said two devices are moved close to each other to thereby achieve the effect of receiving.

Furthermore, at least part of the cable bridles can be coupled to one of the devices, or correspondingly disposed on the moving member and the track, so that the portions of the cable where the bendings are formed can be received or released one by one when the relative motion of the two devices occurs. Accordingly, the multiple stacked sections of the cable may be sequentially formed without generating interferences with other members. This also prevents the cable from overly large tension and stress when the cable is bent or extended due to the motion of the devices. As a result, the swapping system can be moved and maintained in the uninterrupted power state to thereby increase the durability.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A swapping system, comprising:
   a first device, having a receiving space;
   a second device, movably disposed in the receiving space for moving into or moving out of the first device;
   a cable, located in the receiving space and electrically connected between the first device and the second device, wherein the cable is received or released according to a relative motion of the second device and the first device;
   a track, disposed on the first device and located in the receiving space;
   at least one moving member, movably coupled to the track; and
   a plurality of cable bridles, disposed on the cable, wherein at least one of the cable bridle is assembled to the corresponding moving member to move alone the track, and each of the cable bridles comprises:
      a body, being a single piece of flexible sheet divided into a main portion and a plurality of sub portions extended from the main portion; and
      at least one first buckling portion extending from the body, the first buckling portion being buckled to the cable so that the body is contacted against the cable, wherein the cable bridle is in an unstressed state when being bent, and generates an elastic deformation by force when the cable is pulled straight,
   wherein when the cable is received, the cable is deformed by the plurality of cable bridles in two opposite directions to form a plurality of bending portions at places where the cable bridles are located, and a plurality of different sections of the cable are stacked and received along an extending direction of the track.

2. The swapping system according to claim 1, wherein the cable bridles are movably coupled to the first device respectively along a path so that a plurality of portions of the cable are constrained to move on the path when the cable is received or released according to the relative motion of the second device and the first device.

3. The swapping system according to claim 1, wherein an extending direction of the track is parallel to a direction of the relative motion of the second device and the first device.

4. The swapping system according to claim 1, wherein the cable bridles on the cable are assembled on the moving members and spaced apart from each other.

5. The swapping system according to claim 1, wherein the cable bridle comprises a plurality of first buckling portions, each of the first buckling portion comprises an engaging protrusion and an opening respectively disposed at two of the sub portions located on two opposite sides of the main portion and corresponding to each other, the two of the sub portions corresponding to each other are respectively bent relative to the main portion to be partially overlapped, and the two of the sub portions are buckled together due to the engaging protrusion being passed through and engaged with the opening, such that the cable is secured between the main portion and the sub portions, and the main portion and the sub portions are attached to the cable.

6. The swapping system according to claim 5, wherein the cable bridle further comprises:
   a second buckling portion, extending from the main portion and facing away from the first buckling portion, wherein the swapping system further comprises a track and at least one moving member, the track is disposed on the first device and located in the receiving space, the moving member is movably coupled to the track, wherein the moving member has a buckling slot, and the second buckling portion is engaged with the buckling slot to secure the body on the moving member.

7. The swapping system according to claim 6, wherein the body further has a trench, located on the main portion and facing away from the second buckling portion.

8. The swapping system according to claim 1, wherein the first buckling portion comprises a contact protrusion and an elastic locking hook, respectively standing on the body, the elastic locking hook is engaged with the contact protrusion so that the cable passes through in between the body, the contact protrusion and the elastic locking hook, and the elastic locking hook is adapted to generate an elastic deformation by force to be released from the contact protrusion.

9. The swapping system according to claim 8, wherein the cable bridle further comprises:
   a second buckling portion, extending from the body and facing away from the first buckling portion, wherein the swapping system further comprises a track and at least one moving member, the track is disposed on the first device and located in the receiving space, the moving member is movably coupled to the track, wherein the moving member has a buckling slot, and the second buckling portion is engaged with the buckling slot to secure the body on the moving member.

10. A cable bridle mechanism, adapted to a cable, and the cable bridle mechanism comprising:
    a track, having a path;
    a moving member, movably coupled to the track to move along the path, and the moving member having a buckling slot; and
    a plurality of cable bridles, wherein at least one of the cable bridle is assembled to the corresponding moving member to move alone the track, and each of the cable bridles has a body and at least one first buckling portion, the body being a single piece of flexible sheet divided into a main portion and a plurality of sub portions extended from the main portion, the first buckling portion extending from the body to be buckled to the cable, the body having a second buckling portion facing away from the first buckling portion, the second buckling portion being engaged with the buckling slot to secure the body on the moving member, and when the cable is received or released, the cable driving the cable bridle and the moving member to move along the path of the track and forming a bending on a place where the cable and the body are buckled, wherein the cable bridle is in an unstressed state when being bent, and generates an elastic deformation by force when the cable is pulled straight, when the cable is received, the cable is deformed by the plurality of cable bridles in two opposite directions to form a plurality of bending portions at places where the cable bridles are located, and a plurality of different sections of the cable are stacked and received along an extending direction of the track.

11. The cable bridle mechanism according to claim 10, wherein the path is a straight line or an arc line.

12. The cable bridle mechanism according to claim 10, wherein the cable bridle comprises a plurality of first buckling portions, each of the first buckling portion comprises an engaging protrusion and an opening respectively disposed at two of the sub portions located on two opposite sides of the main portion and corresponding to each other, the two of the sub portions corresponding to each other are respectively bent relative to the main portion to be partially overlapped, and the two of the sub portions are buckled together due to the engaging protrusion being passed through and engaged with the opening, such that the cable is secured between the main portion and the sub portions, and the main portion and the sub portions are attached to the cable.

13. The cable bridle mechanism according to claim 12, wherein the body further has a trench, located on the main portion and facing away from the second buckling portion.

14. The cable bridle mechanism according to claim 10, wherein the first buckling portion comprises a contact protrusion and an elastic locking hook, respectively disposed on the body, the elastic locking hook is engaged with the contact protrusion so that the cable passes through in between the body, the contact protrusion and the elastic locking hook, and the elastic locking hook is adapted to generate an elastic deformation by force to be released from the contact protrusion.

15. A cable bridle, adapted to a cable, the cable being electrically connected between a first device and a second device, the first device and the second device being movably assembled together, the cable being received or released according to a relative motion of the first device and the second device, and the cable bridle comprising:

a body, being a single piece of flexible sheet divided into a main portion and a plurality of sub portions extended from the main portion; and at least one first buckling portion extending from the body, the first buckling portion being buckled to the cable so that the body is contacted against the cable, wherein when the cable is received or released according to the relative motion of the first device and the second device, the cable is constrained by the body to form a bending, wherein the cable bridle is in an unstressed state when being bent, and generates an elastic deformation by force when the cable is pulled straight, when the cable is received, the cable is deformed by the plurality of cable bridles in two opposite directions to form a plurality of bending portions where the cable bridles are located;

a track, disposed on the first device;

at least one moving member, movably coupled to the track;

at least one of the cable bridle is assembled to the corresponding moving member to move alone the track, wherein when the second device is moved into the first device and the cable is received, a plurality of different sections of the cable are stacked and received along the extending direction of the track.

16. The cable bridle according to claim 15, wherein the body is movably coupled to the first device.

17. The cable bridle according to claim 16, wherein the first device further comprises a track and a moving member, the moving member is movably coupled to the track, and the body is assembled on the moving member to move along the track.

18. The cable bridle according to claim 16, wherein a motion path of the body on the first device is identical to a path of the relative motion of the first device and the second device.

19. The cable bridle according to claim 15, comprising: a plurality of first buckling portions, each of the first buckling portion comprises an engaging protrusion and an opening respectively disposed at two of the sub portions located on two opposite sides of the main portion and corresponding to each other, the two of the sub portions corresponding to each other are respectively bent relative to the main portion to be partially overlapped, and the two of the sub portions are buckled together due to the engaging protrusion being passed through and engaged with the opening, such that the cable is secured between the main portion and the sub portions, and the main portion and the sub portions are attached to the cable.

20. The cable bridle according to claim 19, further comprising: a second buckling portion, extending from the main portion and facing away from the first buckling portion, the first device further comprises a track and a moving member, the moving member is movably coupled to the track, wherein the moving member has a buckling slot, and second buckling portion is engaged with the buckling slot to secure the body on the moving member.

21. The cable bridle according to claim 20, wherein the body further has a trench, located on the main portion and facing away from the second buckling portion.

22. The cable bridle according to claim 15, wherein the first buckling portion comprises a contact protrusion and an elastic locking hook, respectively disposed on the body, the elastic locking hook is engaged with the contact protrusion so that the cable passes through in between the body, the contact protrusion and the elastic locking hook, and the elastic locking hook is adapted to generate an elastic deformation by force to be released from the contact protrusion.

23. The cable bridle according to claim 22, further comprising: a second buckling portion, extending from the body and facing away from the first buckling portion, the first device further comprises a track and at least one moving member, the moving member is movably coupled to the track, wherein the moving member has a buckling slot, and the second buckling portion is engaged with the buckling slot to secure the body on the moving member.

* * * * *